Figure 1:
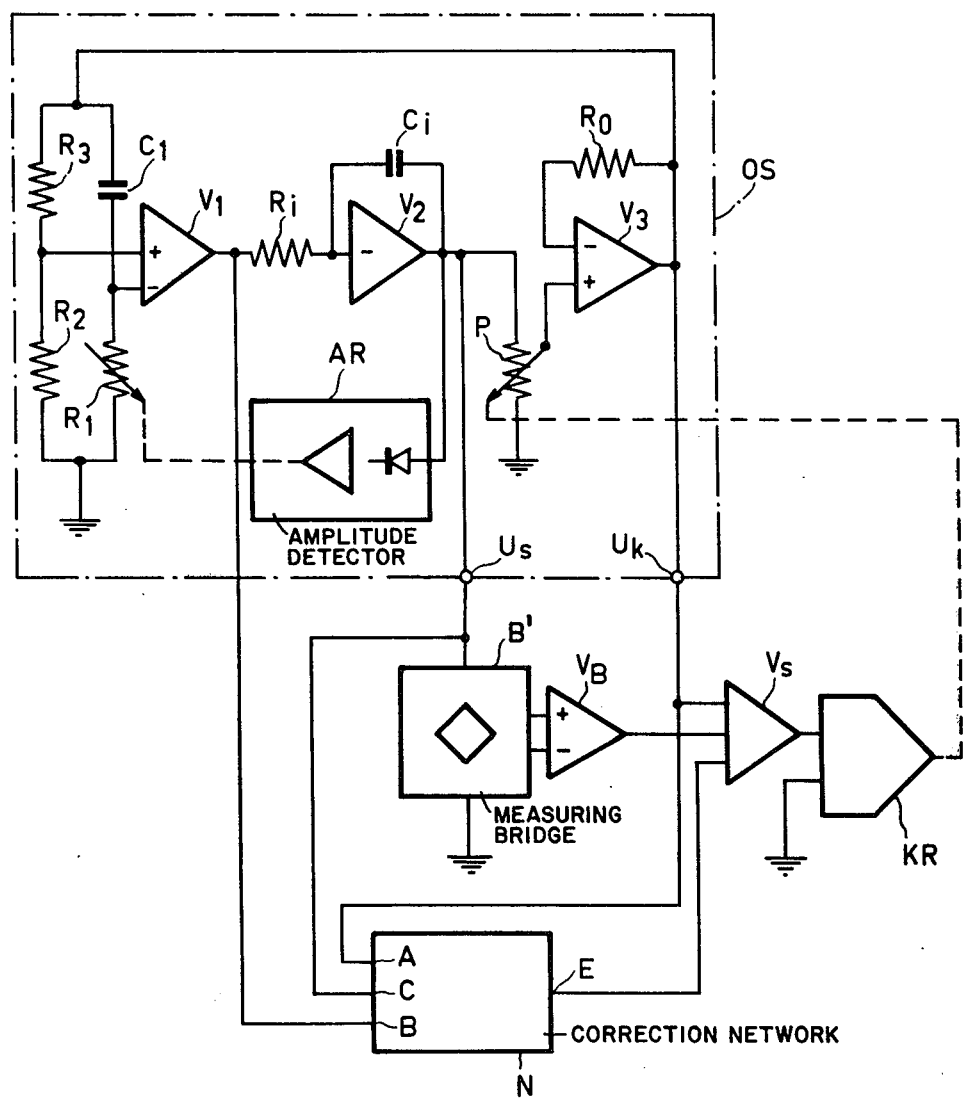

United States Patent [19]

Meyer-Ebrecht

[11] 4,006,430
[45] Feb. 1, 1977

[54] CIRCUIT ARRANGEMENT FOR CONVERTING A BRIDGE UNBALANCE INTO A FREQUENCY VARIATION

[75] Inventor: Dietrich Meyer-Ebrecht, Hamburg, Germany

[73] Assignee: U.S. Philips Corporation, New York, N.Y.

[22] Filed: July 8, 1975

[21] Appl. No.: 594,115

[30] Foreign Application Priority Data

July 10, 1974 Germany .......................... 2433080

[52] U.S. Cl. .............................. 331/65; 324/65 R; 324/DIG. 1; 331/135; 331/138
[51] Int. Cl.² ..................... G01R 27/02; H03B 5/20
[58] Field of Search .............. 331/65, 66, 135, 138; 324/62, 65 R, DIG. 1

[56] References Cited
UNITED STATES PATENTS 3,536,997   10/1970   Holt ................................... 324/62 R
3,845,385   10/1974   Ebrecht ........................... 331/65 X Primary Examiner—Siegfried H. Grimm
Attorney, Agent, or Firm—Frank R. Trifari; Bernard Franzblau

[57] ABSTRACT

The bridge unbalance of a measuring bridge including a measuring transducer is converted into a frequency variation of an RC-oscillator. Since measuring transducers often have characteristics which are not exactly linear, such a conversion, which exactly compensates for said non-linearity, would be effective. For this purpose, correction voltages are derived from the voltages supplied by the oscillator by means of differentiation circuits and integration circuits, which voltages are proportional to the positive respectively the negative powers of the frequency. The differentiation circuits and integration circuits respectively are supplied with oscillator voltages such that at their outputs voltages of the correct phase are obtained. The voltages from the differentiation circuits and integration circuits are added via summing resistors and are superimposed on the compensation voltage of the oscillator.

15 Claims, 3 Drawing Figures

CIRCUIT ARRANGEMENT FOR CONVERTING A BRIDGE UNBALANCE INTO A FREQUENCY VARIATION

The invention relates to a circuit arrangement for converting an unbalance of a resistor bridge having four resistors, which bridge is supplied from a voltage source, into a frequency variation of an RC-oscillator which is proportional thereto. The output terminals of the bridge are connected to the input terminals of a compensation amplifier, whose output voltage directly or indirectly controls a controllable resistor. One of the output terminals of the bridge is moreover connected via a resistor to the output of a negative feedback amplifier, whose input is connected to the voltage source via the controllable resistor. The controllable resistor, as well as the operational amplifier, form part of the frequency-determining network of the RC-oscillator. A further amplifier is connected to the output of the operational amplifier via an all-pass network which includes three ohmic resistors and a capacitor, in which network the one resistor which is connected to ground is controllable. The output of the further amplifier is connected to the input of an integrator and an amplitude detector is connected to the output of the integrator. The detector in turn controls the controllable resistor of the all-pass network in such a way that the voltage at the output of the integrator is constant, said voltage being the supply voltage to the resistor bridge.

By means of this circuit arrangement, described in U.S. Pat. No. 3,845,385, a bridge unbalance is converted exactly linearly into a frequency variation. In the case of a series of measuring transducers employed in such bridge circuits, the relationship between the output quantity and the measuring quantity, however, is only approximately linear. For accurate measurements, said non-linearity of the transducer characteristic should therefore be taken into account. As the frequency which represents the measuring quantity is generally electronically processed, it is therefore also necessary to provide an electronic compensation of the aforesaid non-linearity. This may for, example, be effected by means of known diode function generators or by means of digital function generators. A drawback of diode function generators is the thermal instability and in the case of digital function generators the extensive circuitry.

It is an object of the invention to provide a simple and inexpensive, yet extremely stable circuit arrangement, by means of which non-linearities of measuring transducers can be compensated for to a greater extent. According to the invention this problem is solved in that the output voltages of one or more differentiation circuits and/or integration circuits of at least partly different order, which are connected to the oscillator, are applied to the input of the compensation amplifier and are superimposed on the compensation voltage. These output voltages are effectively applied to the input of the compensation amplifier via weighting resistors, for example by means of a summing amplifier. In the oscillator the output of the further amplifier, the output of the integrator and the output of the operational amplifier may be used as connection points for the differentiation circuits and integration circuits respectively, which outputs either exhibit a different mutual phase relationship or a frequency dependence. The connection points for the individual differentiation circuits and integration circuits respectively are selected so that their output voltages have the correct phase, as the case may be, by means of an additional inverter.

Figure 2:
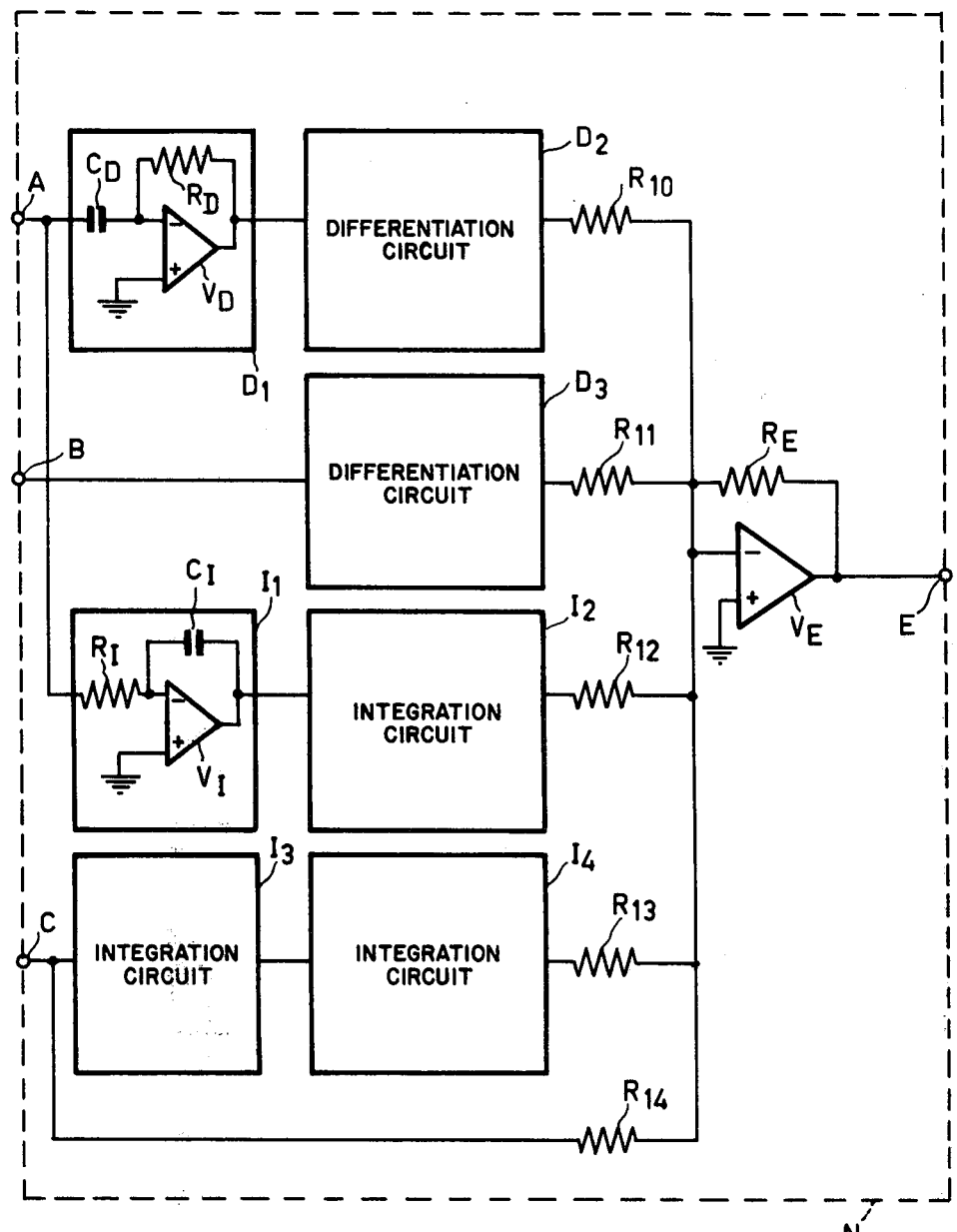
Figure 3:
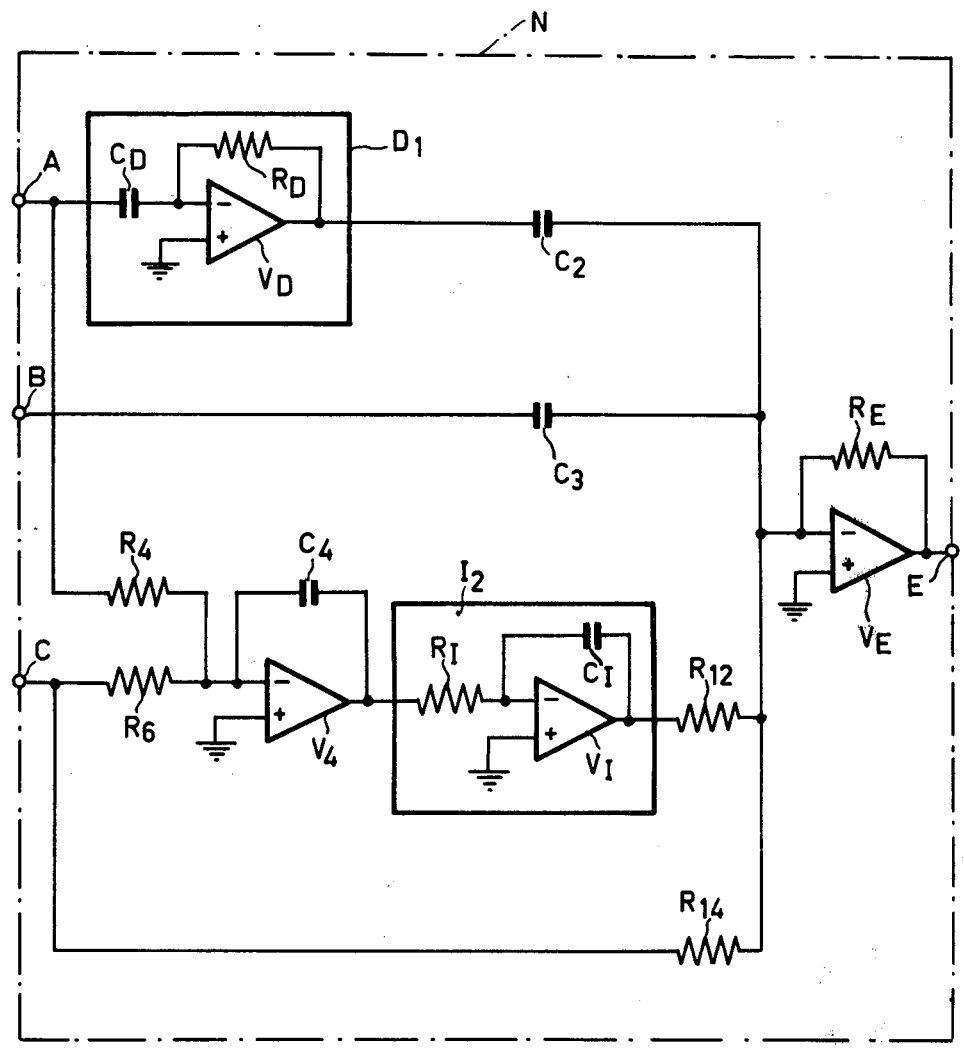

Embodiments of the invention will be described with reference to the drawing. In the drawing:

FIG. 1 shows a block diagram of a complete circuit arrangement according to the invention, FIG. 2 shows a network for the formation of non-linear frequency-dependent voltages, and FIG. 3 is a simplified version of a network in accordance with FIG. 2.

In FIG. 1 the oscillator OS includes a negative feedback operational amplifier $V_3$, which supplies the compensation voltage $U_k$ as well as the supply voltage for the all-pass network consisting of the resistors $R_1$, $R_2$, $R_3$ and the capacitor $C_1$. The outputs of the all-pass network, which is connected as a bridge, are connected to the inputs of the amplifier $V_1$, which takes the form of a differential amplifier. The output of amplifier $V_1$ supplies an integrator consisting of the high-gain inverting amplifier $V_2$, an integration capacitor $C_i$ which shunts said amplifier, and a preceding ohmic resistor $R_i$. The output of the integrator is connected to an amplitude detector AR, which in turn varies the grounded variable resistance $R_1$ in the all-pass network in such a way that the amplitude of the voltage at the output of the integrator is always constant. The output voltage of the integrator also constitutes the supply voltage $U_s$ of the bridge B', which for simplicity is represented as a block. The integrator further supplies the potentiometer P, whose output is connected to the non-inverting input of the operational amplifier $V_3$ and whose dividing ratio is controlled by the compensation amplifier KR. The frequency of the voltage supplied by the oscillator OS is linearly dependent on the dividing ratio adjusted with the potentiometer P and thus linearly on the bridge unbalance.

The output voltage of the bridge B' is first applied to a differential amplifier $V_B$ whose output is connected to a summing amplifier $V_S$. The output of said summing amplifier is connected to the input of the compensation amplifier KR, whose output signal controls the potentiometer P. The compensation voltage at the output of the operational amplifier $V_3$ is applied, via a further input to the summing amplifier $V_S$, in such a way that the voltage produced by the unbalance bridge B' is compensated for.

In order to compensste for non-linearities of the bridge B' and of the measuring transducer included therein, the summing amplifier $V_S$ comprises another input, which is connected to the output E of a network N. From voltages at the connection points of the oscillator OS, said network derives different voltages which have the same phase as the constant-amplitude supply voltage $U_s$ of the bridge B' and the compensation voltage $U_k$, but which depend on the frequency in a non-linear manner. The voltages produced in the network N are proportionally added to or subtracted from the compensation voltage in the summing amplifier $V_S$, which is only possible in the case of phase equality or phase opposition respectively. The bridge unbalance caused by the variation of the bridge resistor or resistors to be measured, is then no longer exclusively compensated by the frequency-proportional compensation voltage $U_k$, but also proportionally by the said correction voltages produced in the network N so that a corresponding non-linear relationship between the bridge unbalance and the oscillator frequency is obtained.

FIG. 2 shows an example of a network N which in FIG. 1 is represented as a block. The network N comprises a number of similar differentiation circuits $D_1$, $D_2$ and $D_3$ which each consist of a high-gain inverting differential amplifier $V_D$, a differentiation resistor $R_D$ which shunts said amplifier, and a differentiation capacitor $C_D$ which precedes the amplifier input. Furthermore, four similar integration circuits $I_1$, $I_2$, $I_3$ and $I_4$ are provided which each comprise a high-gain integration amplifier $V_I$, an integration capacitor $C_I$ which shunts said amplifier and an integration resistor $R_I$ which precedes the amplifier input. The operation of these circuits will be explained hereinafter.

By differentiation of the compensation voltage $U_k$, which is proportional to the frequency, a voltage is obtained which is a quadratic function of the frequency. This voltage, however, is 90° phase-shifted, so that it is not suitable for compensation of a bridge unbalance. However, at the output of the all-pass differential amplifier $V_1$ a voltage is available which, relative to the compensation voltage $U_k$, has a constant frequency-independent amplitude ratio but which is at least 90° phase-shifted. When said voltage is differentiated, the desired voltage of the correct phase is obtained with a quadratically frequency-dependent amplitude. This is effected with the aid of the differentiation circuit $D_3$ whose input B is connected to the output of the all-pass differential amplifier $V_1$. By double differentiation of the compensation voltage $U_k$, it is also possible to obtain a voltage of the correct phase, but whose amplitude is proportional to the third power of the frequency. This is effected by means of the cascaded differentiation circuits $D_1$ and $D_2$. By integration of the constant-amplitude bridge-supply voltage $U_s$, however, a voltage can be obtained whose amplitude is inversely proportional to the frequency. However, said voltage is not suited for compensation because, relative to the compensation voltage, it is at least minus 90° phase shifted. However, a voltage of the correct phase, which is inversely proportional to the frequency, can also be obtained by double integration of the frequency-proportional compensation voltage $U_k$. This is effected by means of the integration circuits $I_1$ and $I_2$. By twice integrating the bridge supply voltage $U_s$ by means of the cascaded integration circuits $I_3$ and $I_4$, whose first input C is connected to the bridge supply voltage $U_s$, a voltage of the correct phase is obtained which is inversely proportional to the square of the frequency.

When the characteristic of the measuring transducer to be linearized, $\Delta R/R = g(X)$ in which $X$ = measuring quantity, is represented by a series expansion $$\sum_{i=-2}^{i=+3} a_i \cdot f^i = g(X)$$

so that to a satisfactory approximation $f \sim X$, the voltages produced by the differentiation circuits $D_1$, $D_2$, $D_3$ and by the integration circuits $I_1$, $I_2$, $I_3$ and $I_4$ may be added with the correct weight via the summing resistors $R_{10}$ to $R_{13}$ of the amplifier $V_E$, which includes negative feedback via a resistor $R_E$, and applied to the compensation amplifier KR via the summing amplifier $V_S$. The correct weight is obtained by making the summing resistors correspond to the associated coefficients of the series expansion. Via the resistor $R_{14}$ a component of constant amplitude corresponding to the coefficient $a_0$ is added to the aforesaid voltages. If required, inverting amplifiers, not shown, may be connected in series for correction of the sign, or a summing amplifier with positive and negative inputs may be used. The integration circuits, which produce voltages proportional to the negative powers of the frequency, in particular influence the low frequency end of the conversion characteristic, while the voltage components produced by the differentiation circuits, which are proportional to the positive powers of the frequency, substantially influence the high-frequency end thereof. When in the case of extreme curvatures of the transducer characteristic correction elements of a higher order are required, these may be realized with the correct phase by double differentiation or integration respectively of correction voltages which are proportional to a power of the frequency which is each time two less. For example, a voltage proportional to the fourth power of the frequency can be obtained by double differentiation of the output voltage of the differentiation circuit $D_3$ by means of two further identical differentiation circuits.

A modification of the network of FIG. 2 having the same effect is shown in FIG. 3, in which some circuit components may be dispensed with. The amplifiers in the differentiation circuits $D_2$ and $D_3$ may be replaced by the amplifier $V_E$, so that the differentiation capacitors $C_2$ and $C_3$ are directly connected to the input of this amplifier. Weighting can then be achieved by a voltage divider (not shown) which precedes the differentiation circuit or the differentiation capacitors respectively. Furthermore, the voltages at the inputs A and C of the network may be integrated together via the same chain of integration circuits, so that the two integration circuits $I_3$ and $I_4$ with associated amplifiers are dispensed with. The weighted summation is then effected at the input of the integration circuit which corresponds to the integration circuit $I_1$ in FIG. 2. This circuit consists of the amplifier $V_4$ and the capacitor $C_4$. The weighted summing resistors $R_4$ and $R_6$ together serve the integration resistance for the integration circuit. Furthermore, the amplifier $V_E$ may be dispensed with or be combined with the summing amplifier $V_S$ in FIG. 1, if said summing amplifier can be provided with suitable additional summing inputs.

Depending on the number of differentiation circuits and integration circuits used, the circuit arrangement described hereinbefore is capable of compensating for substantially arbitrary non-linearities of measuring transducers. Moreover, it provides the very interesting possibility of exactly linearizing the quadratic relationship between, for example, the flow rate and the differential pressure in the case of a flow transducer in accordance with the differential pressure principle. In this respect it is also possible to introduce a zero offset of the frequency (life zero), i.e. that a finite frequency is obtained already for the measuring value zero. This is very advantageous for transmission and for calibration purposes.

What is claimed is:

1. A circuit for the conversion of an unbalance of a resistor bridge into a frequency variation of an RC-oscillator which is proportional thereto comprising, a resistor bridge having input terminals coupled to a voltage supply terminal of the RC-oscillator, means connecting the output terminals of the bridge to the input terminals of a compensation amplifier, a first controllable resistor controlled by the output voltage of the compensation amplifier, a negative feedback operational amplifier having an input connected to the voltage supply terminal via the first controllable resistor, means connecting the first controllable resistor and the operational amplifier in circuit so as to form a part of a frequency determining network of the RC-oscillator, a further amplifier connected to the output of the operational amplifier via an all-pass network which includes three ohmic resistors and a capacitor, one of said network resistors comprising a second controllable resistor connected to a point of reference potential, means connecting the output of the further amplifier to the input of an integrator and an amplitude detector to the output of the integrator, means coupling the detector to the second controllable resistor of the all-pass network so that the detector controls the second controllable resistor in a manner such that the voltage at the output of the integrator is constant, means coupling the output of the integrator to said voltage supply terminal, at least one differentiation circuit and one integration circuit coupled to the oscillator, means coupling a compensation voltage developed at the output of the negative feedback operational amplifier to the input of the compensation amplifier, and means coupling the output voltages of the differentiation and integration circuits to the input of the compensation amplifier so as to be superimposed on the compensation voltage.

2. A circuit as claimed in claim 1, wherein the output voltages of the differentiation and integration circuits are applied to the input of the compensation amplifier via a summing circuit including weighting resistors.

3. A circuit as claimed in claim 1 including means coupling the output of the further amplifier, the output of the integrator and the output of the operational amplifier to the differentiation and integration circuits such that the output voltages thereof are in phase with or in phase opposition to the bridge output voltage.

4. A circuit as claimed in claim 3, wherein a differentiation circuit and an integration circuit are connected to the output of the integrator and to the output of the operational amplifier via weighting resistors.

5. A measuring apparatus for converting a resistance variation into a corresponding frequency variation of an oscillator comprising, a resistance bridge having a resistor with a non-linear characteristic in one arm thereof, a compensation amplifier with its input coupled to the output of the resistance bridge, an oscillator comprising, in cascade, an all-pass network, a first amplifier, an integrator and a negative feedback amplifier, said all-pass network including a first controllable resistor and a capacitor, means responsive to the integrator output signal for varying said first controllable resistor so as to maintain the integrator output voltage constant, a voltage supply terminal coupling the output of the integrator to the input of the resistance bridge, a second controllable resistor coupled between the integrator output and an input of the negative feedback amplifier and controlled by the output voltage of the compensation amplifier, means coupling the output of the negative feedback amplifier to the input of the all-pass network, means coupling the output of the negative feedback amplifier to the input of the compensation amplifier to supply a compensation voltage thereto, a network for deriving a plurality of non-linear frequency-dependent voltages comprising differentiation circuit means and integration circuit means of at least partly different order, means coupling the input of said network to circuit points in the oscillator such that the voltages derived at the output of the network are in phase with or in phase opposition to the compensation voltage, and means coupling the voltages at the network output to the input of the compensation amplifier.

6. A measuring apparatus as claimed in claim 5 wherein said network differentiation circuit means includes a first differentiator circuit with its input coupled to the output of the negative feedback amplifier and its output coupled to the input of the compensation amplifier.

7. A measuring apparatus as claimed in claim 6 wherein said network integration circuit means includes first and second integrator circuits connected in cascade between the output of the oscillator integrator and the input of the compensation amplifier.

8. A measuring apparatus as claimed in claim 7 wherein said network differentiation circuit means further comprises a second differentiator circuit with its input coupled to the output of the first amplifier and its output coupled to the input of the compensation amplifier.

9. A measuring apparatus as claimed in claim 8 wherein said network differentiation circuit means includes a third differentiator circuit coupled between the output of the first differentiator circuit and the input of the compensation amplifier and the network integration circuit means includes third and fourth integrator circuits connected in cascade between the output of the negative feedback amplifier and the input of the compensation amplifier.

10. A measuring apparatus as claimed in claim 9 further comprising a summing circuit with weighting resistors coupled between the network outputs and the input of the compensation amplifier.

11. A measuring apparatus as claimed in claim 7 further comprising first and second weighting resistors coupling the input of the first integrator circuit to the outputs of the negative feedback amplifier and the oscillator integrator, respectively.

12. A measuring apparatus as claimed in claim 11 wherein said network differentiation circuit means further comprises a second differentiator circuit with its input coupled to the output of the first amplifier and its output coupled to the input of the compensation amplifier.

13. A measuring apparatus as claimed in claim 7 further comprising a weighting resistor directly coupling the output of the oscillator integrator to the input of the compensation amplifier.

14. A measuring apparatus as claimed in claim 5 wherein said network integration circuit means includes first and second integrator circuits connected in cascade between the output of the oscillator integrator and the input of the compensation amplifier and between the output of the negative feedback amplifier and the input of the compensation amplifier.

15. A measuring apparatus as claimed in claim 5 wherein the non-linear resistor comprises a measuring transducer for converting a physical parameter into an electric signal.

* * * * *

UNITED STATES PATENT AND TRADEMARK OFFICE
CERTIFICATE OF CORRECTION

PATENT NO. : 4,006,430
DATED : February 1, 1977
INVENTOR(S) : DIETRICH MEYER-EBRECHT It is certified that error appears in the above-identified patent and that said Letters Patent are hereby corrected as shown below:

IN THE SPECIFICATION

Column 1, line 15, after "feedback" it should read

--operational--;

Signed and Sealed this

Twenty-eighth Day of June 1977

[SEAL]

Attest:

RUTH C. MASON
*Attesting Officer*

C. MARSHALL DANN
*Commissioner of Patents and Trademarks*